(12) United States Patent
Okada

(10) Patent No.: US 9,651,685 B2
(45) Date of Patent: May 16, 2017

(54) RADIATION DETECTION ELEMENT AND RADIOGRAPH DETECTION DEVICE

(71) Applicant: FUJIFILM CORPORATION, Minato-ku, Tokyo (JP)

(72) Inventor: Yoshihiro Okada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/658,249

(22) Filed: Mar. 16, 2015

(65) Prior Publication Data

US 2016/0178763 A1 Jun. 23, 2016

Related U.S. Application Data

(63) Continuation of application No. PCT/JP2013/076421, filed on Sep. 27, 2013.

(30) Foreign Application Priority Data

Sep. 28, 2012 (JP) ................................ 2012-218426

(51) Int. Cl.
*H01L 27/146* (2006.01)
*G01T 1/24* (2006.01)
(Continued)

(52) U.S. Cl.
CPC .............. *G01T 1/241* (2013.01); *G01T 1/247* (2013.01); *H01L 27/14603* (2013.01);
(Continued)

(58) Field of Classification Search
CPC .. G01T 1/247; G01T 1/00; G01T 1/17; G01T 1/2928; H04N 27/14658; H04N 27/14676
See application file for complete search history.

(56) References Cited

U.S. PATENT DOCUMENTS

2004/0169125 A1* 9/2004 Yamada ............ H01L 27/14603
250/208.1
2007/0064133 A1 3/2007 Shizuishi
(Continued)

FOREIGN PATENT DOCUMENTS

JP 2003-255049 A 9/2003
JP 2007081140 A 3/2007
(Continued)

OTHER PUBLICATIONS

The Extended European Search Report dated Apr. 8, 2016, from the EPO in an European patent application corresponding to the instant patent application.
(Continued)

*Primary Examiner* — Kiho Kim
(74) *Attorney, Agent, or Firm* — Solaris Intellectual Property Group, PLLC

(57) ABSTRACT

A radiation detection element includes plural hexagonal pixels arrayed in a honeycomb form and having sensor portions that generate charges due to radiation being irradiated. The radiation detection element includes charge accumulating capacitors that accumulate generated charges, and TFT switches for reading-out the charges accumulated at the capacitors. The radiation detection element includes scan lines disposed parallel in a first direction, to which switching signals that control switching of the TFT switches are outputted; and data lines disposed parallel in a second direction intersecting the first direction, to which charges read-out by the TFT switches are outputted. The TFT switches are disposed to be, in the first direction, connected to the data lines from alternately different sides of the data line, and such that an arrangement of source electrodes and drain electrodes of the TFT switches is the same in the first direction.

10 Claims, 14 Drawing Sheets

(51) Int. Cl.
*H01L 31/0272* (2006.01)
*H01L 31/08* (2006.01)
(52) U.S. Cl.
CPC .. *H01L 27/14605* (2013.01); *H01L 27/14632* (2013.01); *H01L 27/14676* (2013.01); *H01L 31/0272* (2013.01); *H01L 31/085* (2013.01); *H01L 27/14643* (2013.01)

(56) References Cited

U.S. PATENT DOCUMENTS

| | | |
|---|---|---|
| 2007/0177044 A1 | 8/2007 | Maruyama et al. |
| 2008/0088723 A1* | 4/2008 | Furuta .................. H04N 9/045 348/294 |
| 2009/0032680 A1* | 2/2009 | Watanabe ......... H01L 27/14658 250/208.1 |
| 2010/0059753 A1* | 3/2010 | Andrews ........... H01L 29/78603 257/59 |
| 2011/0121189 A1 | 5/2011 | Okada |
| 2011/0174957 A1 | 7/2011 | Okada |
| 2013/0038768 A1 | 2/2013 | Maruyama et al. |
| 2013/0068952 A1* | 3/2013 | Kuwabara ............... A61B 6/04 250/366 |
| 2014/0138552 A1 | 5/2014 | Okada |

FOREIGN PATENT DOCUMENTS

| | | |
|---|---|---|
| JP | 2007201269 A | 8/2007 |
| JP | 2011-109012 A | 6/2011 |
| JP | 2011-146587 A | 7/2011 |
| WO | 2013/024671 A1 | 2/2013 |

OTHER PUBLICATIONS

Taiwan Office Action dated Dec. 26, 2016 in corresponding Taiwan Patent Application No. 102135035 and a Partial English Translation thereof.

* cited by examiner

RADIATION DETECTION ELEMENT AND RADIOGRAPH DETECTION DEVICE

CROSS-REFERENCE TO RELATED APPLICATIONS

This application is a continuation application of International Application No. PCT/JP2013/076421, filed Sep. 27, 2013, the disclosure of which is incorporated herein by reference in its entirety. Further, this application claims priority from Japanese Patent Application No. 2012-218426, filed Sep. 28, 2012, the disclosure of which is incorporated herein by reference in its entirety.

BACKGROUND

Technical Field

The present invention relates to a radiation detection element and a radiograph detection device. In particular, the present invention relates to a radiation detection element and a radiograph detection device in which the pixels are arranged in the form of a honeycomb.

Related Art

FPDs (Flat Panel Detectors), in which an X-ray sensitive layer is disposed on a TFT (Thin Film Transistor) active matrix substrate and that can convert X-ray information directly into digital data, have been used as radiation detection elements in most radiograph detection devices in recent years. Decreasing the pixel size is effective in improving the resolution of the FPD. Pixel size contributes to an improvement in resolution particularly in direct-conversion-type radiation detection elements that use selenium (Se) in the photoelectric conversion layer that absorbs radiation and converts the radiation into charges. Therefore, in recent years, attempts have been made to improve image quality by making the pixel size more fine.

On the other hand, in an FPD, the amount of charge that can be collected decreases in proportion to the reduction in pixel size, and the S/N decreases. Therefore, even if the resolution improves, the comprehensive image quality DQE deteriorates. Thus, improving the resolution, maintaining the S/N, and aiming for an improvement in the utilization efficiency of light by making the shape of the pixels into a hexagonal shape or the like and arraying the pixels in the form of a honeycomb has been proposed (see, for example, Patent Documents 1 through 4).

For example, Patent Document 1 describes a radiation detection element 200 of a structure in which, as shown in FIG. 14, numerous, plural, hexagonal pixels 20 are arrayed in a two-dimensional form while adjacent to one another, and are arrayed in the form of a honeycomb. Each of the pixels 20 has a thin-film transistor 4 (hereinafter called TFT switch 4).

Further, plural scan lines 101, that extend in the X direction (row direction) that is the lateral direction in FIG. 14 and that are disposed so as to be lined-up in the Y direction (column direction) that is orthogonal to the X direction, and plural data lines 3, that intersect these scan lines 101 and extend in the Y direction while bending along peripheral edges of the pixels 20, are disposed at the radiation detection element 200. Further, at the radiation detection element 200, plural common ground lines 30 are disposed between the plural data lines 3 without intersecting these plural data lines 3 and while intersecting the plural scan lines 101.

As shown in FIG. 14, the scan lines 101 are disposed one-by-one with respect to pixel rows 20a~20d that are each formed from plural pixels, and are connected to gate electrodes 2 that structure the TFT switches 4 that are formed at the respective pixels 20. A source electrode 9 and a drain electrode 13 that structure the TFT switch 4 are formed at the upper layer of the gate electrode 2 and the like. The data lines 3 are formed, together with the source electrodes 9 and the drain electrodes 13, in the wiring layer in which the source electrode 9 and the drain electrode 13 are formed. The data lines 3 are disposed so as to be bent along peripheral edges of the pixels 20 so as to detour between adjacent pixels and pixels, and are connected to the source electrodes 9 that are formed at the pixels 20 of the respective pixel rows. Namely, the data line 3 extends in the column direction while running along three sides that are continuous among the peripheral edges (the six sides) of each pixel 20.

Further, the radiation detection element 200 is a structure in which the arrangement of the TFT switches 4 at the respective pixels 20 differs per pixel row 20a~20d. More concretely, at each pixel of the pixel rows 20a-20d, the TFT switch 4 is disposed at a region that is surrounded by a line segment, that divides the pixel in two in the lengthwise direction, and the three sides at which the data line 3 is continuously provided among the peripheral edges of the pixel.

Further, at the pixels of the pixel row 20a, the TFT switches 4 are disposed in the regions at the right side halves of the pixels 20, and, at the pixels of the pixel row 20b that is positioned at the tier beneath the pixel row 20a, the TFT switches 4 are disposed in the regions at the left side halves of the pixels 20. Thereafter, similarly, the TFT switches 4 are disposed in the regions at the right side halves of the pixels 20 at the pixel row 20c, and are disposed in the regions at the left side halves of the pixels 20 at the pixel row 20d, respectively.

By arranging the TFT switches 4 in this way, at the pixels 20 that are positioned in the pixel row 20a, the source electrodes 9 of the TFT switches 4, that are disposed in the regions at the right side halves of the pixels, are connected to the data line 3 that is provided continuously at the three sides of the regions at the right side halves of the pixels. Further, at the pixels 20 of the pixel row 20b, the source electrodes 9 of the TFT switches 4, that are disposed in the regions at the left side halves of the pixels, are connected to the data line 3 that is provided continuously at the three sides of the regions at the left side halves of the pixels. The same holds for the pixel row 20c and the pixel row 20d. The source electrodes 9 of the TFT switches 4 are connected to the data line 3 that is provided continuously at the three sides of the regions at the right side halves of the pixels at the pixel row 20c and at the three sides of the regions at the left side halves of the pixels at the pixel row 20d.

Namely, in the radiation detection element 200 shown in FIG. 14, the orientation of the TFT switches 4 is different at the pixel rows of the $2N+1^{st}$ tiers (N is an integer) in the Y direction (the odd-numbered pixel rows), and at the pixels rows of the $2N+2^{nd}$ tiers (the even-numbered pixel rows). Namely, the positional relationship of the source electrode 9 and the drain electrode 13 in the X direction is inverted.

Patent Document 1: PCT/JP2012/068722
Patent Document 2: Japanese Patent Application Laid-Open (JP-A) No. 2003-255049
Patent Document 3: Japanese Patent Application Laid-Open (JP-A) No. 2011-109012
Patent Document 4: Japanese Patent Application Laid-Open (JP-A) No. 2011-146587

However, in a structure in which the orientation of the TFT switches 4 changes per tier as described above, if the position of the photomask is offset at the time of fabricating the TFT switches 4, there is the problem that the parasitic capacitance of the TFT switches 4, and concretely, parasitic capacitance Cgdt between the gate and the drain and parasitic capacitance Cgst between the gate and the source vary cyclically per tier.

For example, at the time of forming the data layer, in which the source electrodes 9 and the drain electrodes 13 are disposed, on the gate layer in which the gate electrodes 2 are disposed, even in a case in which the position of the photomask is offset in the Y direction, the directions of the positional offset between the gate and the drain and the positional offset between the gate and the source are the same direction at the pixel rows of the $2N+1^{st}$ tiers and the pixel rows of the $2N+2^{nd}$ tiers, and therefore, the parasitic capacitances Cgdt, Cgst do not vary cyclically per tier.

On the other hand, if the position of the photomask is offset in the X direction, the positional offset between the gate and the drain and the positional offset between the gate and the source vary in different directions at the pixel rows of the $2N+1^{st}$ tiers and the pixel rows of the $2N+2^{nd}$ tiers. Therefore, the changes in the parasitic capacitances Cgdt, Cgst per tier vary cyclically per tier such as, for example, the parasitic capacitances Cgdt, Cgst both increase at the pixels of the $2N+1^{st}$ tiers and the parasitic capacitances Cgdt, Cgst both decrease at the pixels of the $2N+2^{nd}$ tiers, and image artifacts arise.

This problem is described more concretely.

In the radiation detection element 200 such as described above, even in cases in which radiation is not being irradiated, uniform offset charges are accumulated due to various factors. The accumulated offset charges contain charges that have leaked from the radiation detection element and feed-through charges of the TFT switches 4. Among these, it is the feed-through charges that are problematic.

Here, given that the feed-through charge due turning on/off the gate of the TFT switch 4 of the pixel electrode is Qft1, Qft1 is expressed by the following formula.

$$Qft1 = \text{Qft\_on} + \text{Qft\_off} \quad (1)$$
$$= [Cgst(\text{on}) - Cgst(\text{off})] \times Vpp$$
$$= \Delta Cgst \times Vpp$$

Here, Qft_on is the charge at the time when the gate changes from off to on, Qft_off is the charge at the time when the gate changes from on to off, Cgst(on) is the parasitic capacitance between the gate and the source at the time when the gate changes from off to on, Cgst(off) is the parasitic capacitance between the gate and the source at the time when the gate changes from on to off, ΔCgst is the difference between Cgst(on) and Cgst(off), and Vpp is the power source voltage.

On the other hand, in actuality, charges that are generated at the drain electrode side also are transmitted through the signal lines and are directly read-out by the amp circuits, and, given that this component is Qft2, Qft2 is expressed by the following formula.

$$Qft2 = Qft2\_\text{on} + Qft2\_\text{off} \quad (2)$$
$$= [Cgdt(\text{on}) - Cgdt(\text{off})] \times Vpp$$
$$= \Delta Cgdt \times Vpp$$

Here, Qft2_on is the charge at the time when the gate changes from off to on, Qft2_off is the charge at the time when the gate changes from on to off, Cgdt(on) is the parasitic capacitance between the gate and the drain at the time when the gate changes from off to on, Cgdt(off) is the parasitic capacitance between the gate and the drain at the time when the gate changes from on to off, and ΔCgdt is the difference between Cgdt(on) and Cgdt(off).

From above formulas (1) and (2), the entire feed-through charge Qft is expressed by the following formula.

$$Qft=Qft1+Qft2=[\Delta Cgdt+\Delta Cgst]*Vpp \quad (3)$$

Further, in a case in which the position of the photomask is offset in the X direction at the time of fabricating the TFT switches 4 as described above, the values of ΔCgdt and ΔCgst fluctuate in the increasing direction at ones of the pixels of the $2N+1^{st}$ tiers and the pixels of the $2N+2^{nd}$ tiers, and in the decreasing direction at the others. Due thereto, the feed-through charges vary regularly per tier of pixel row. Therefore, for example, at the pixel rows of the $2N+2^{nd}$ tiers, the offset values become high as compared with the pixel rows of the $2N+1^{st}$ tiers, and image artifacts arise.

SUMMARY

The present invention provides a radiation detection element and a radiograph detection device that can suppress image artifacts.

A radiation detection element of the present invention comprises: a plurality of polygonal pixels that are arrayed in a form of a honeycomb, and that have charge generating/accumulating portions that generate and accumulate charges due to irradiation being irradiated, and switching elements that are connected to the charge generating/accumulating portions and that are for reading-out charges accumulated at the charge generating/accumulating portions; a plurality of scan lines that are disposed in parallel in a first direction, and to which switching signals, that control switching of the switching elements, are outputted; and a plurality of data lines that are disposed in parallel in a second direction that intersects the first direction, and to which the charges, that have been read-out by the switching elements, are outputted, wherein the plurality of switching elements respectively are disposed so as to be, in the first direction, connected to the data lines from alternately different sides of the data line corresponding thereto, and such that an arrangement of source electrodes and drain electrodes of the switching elements is the same in the first direction.

Further, the present invention may be structured such that a channel width direction of the switching elements is parallel to the scan lines.

Further, the present invention may be structured such that the data lines are disposed so as to be bent along some of peripheral edges of the polygonal pixels, and the switching elements are disposed on the scan lines.

Further, the present invention may be structured such that the source electrodes of the switching elements are connected rectilinearly to the data lines.

Further, the present invention may be structured such that, per pixel row that is demarcated by the plurality of scan lines, the charge generating/accumulating portions and the switching elements are disposed alternately at one side or another side of the data lines.

Further, the present invention may be structured so as to comprise a plurality of common lines that extend rectilinearly between the plurality of data lines, and at which the charge generating/accumulating portions are fixed to a predetermined potential.

Further, the present invention may be structured such that the polygonal pixel is a hexagonal pixel.

Further, the present invention may be structured such that the polygonal pixel is a rhomboid pixel.

Further, the present invention may be structured such that the polygonal pixel is a rectangular pixel.

A radiograph detection device of the present invention comprises: the radiation detection element of the present invention; a scan signal control section that outputs, to the plurality of scan lines, signals that carry out switching control of the switching elements; and a signal processing section that detects electric signals that correspond to the charges transferred via the plurality of data lines, and carries out predetermined processings on the detected electric signals, and generates digital image data.

Advantageous Effects of Invention

The present invention has the effect of being able to suppress image artifacts.

DESCRIPTION OF EMBODIMENTS

Figure 1:
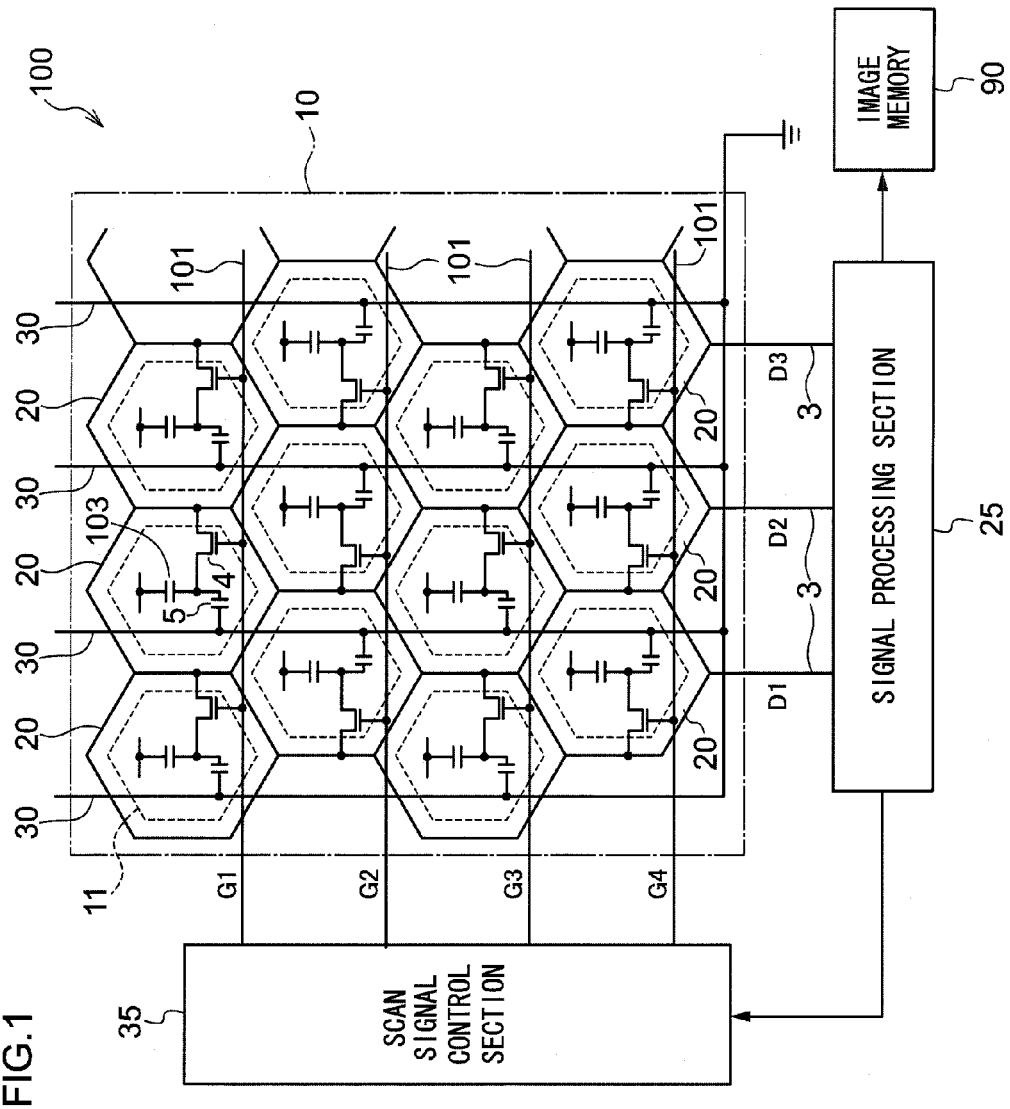
FIG. 1 is a drawing showing the overall structure of a radiograph detection device.
Figure 2:
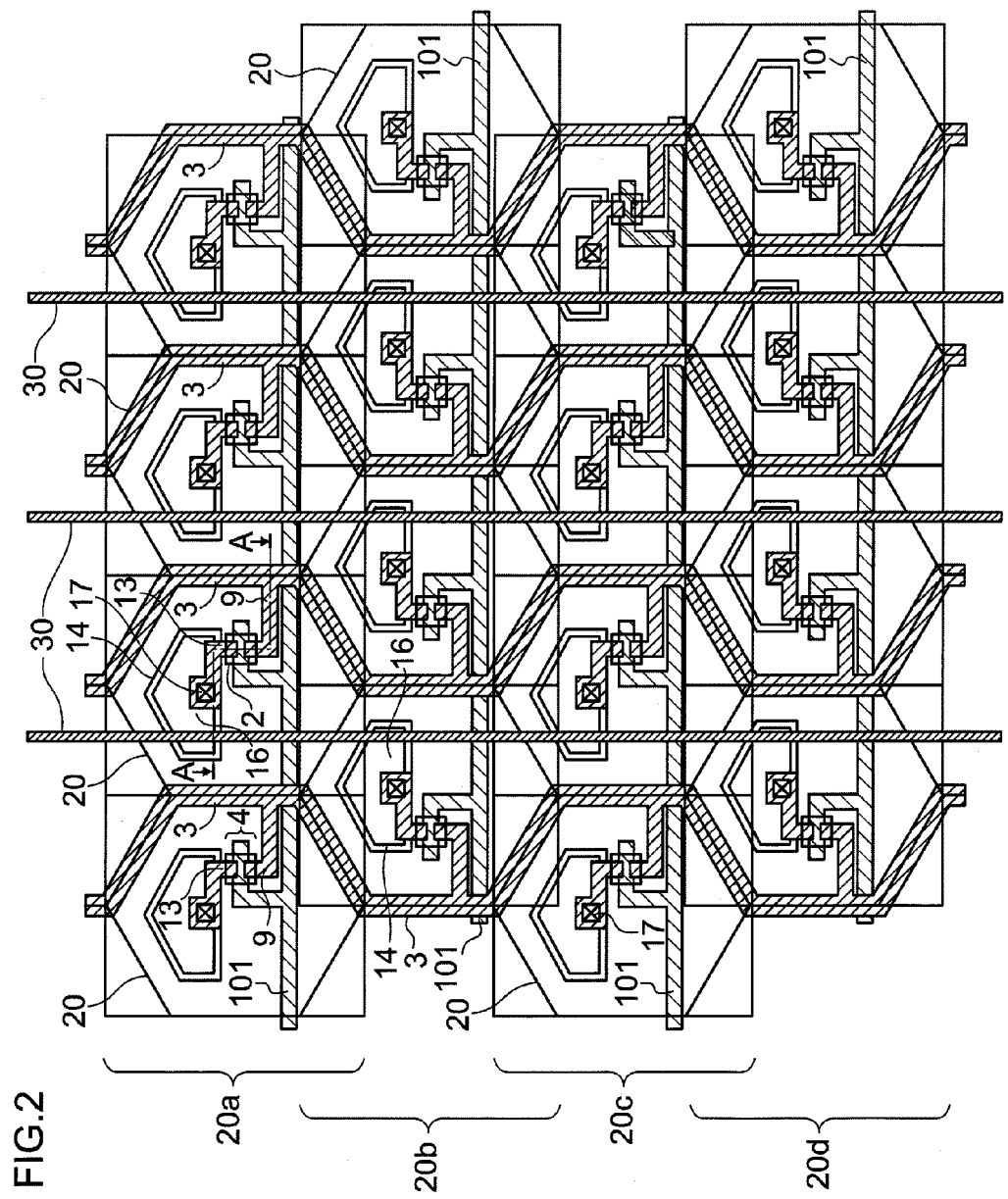
FIG. 2 is a plan view schematically showing the structure of pixel units at a radiation detection element.
Figure 3:
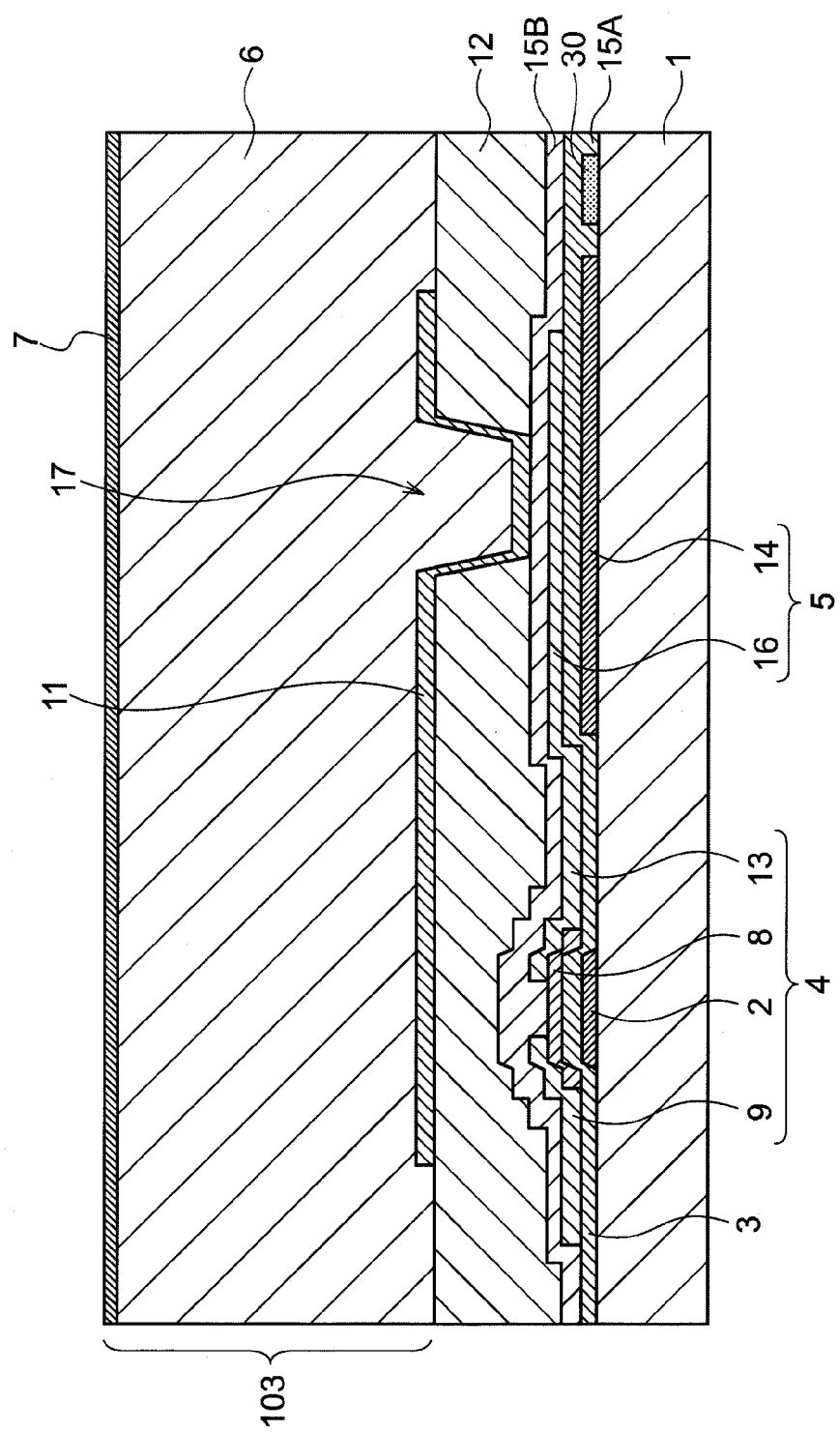
FIG. 3 is a cross-sectional view along line A-A of FIG. 2.

Embodiments of the present invention are described hereinafter with reference to the drawings. FIG. 1 shows the overall structure of a radiograph detection device relating to an embodiment of the present invention. Further, FIG. 2 is a plan view schematically showing the structure of pixel units at a radiation detection element 10 of a radiograph detection device 100 relating to the present embodiment. Moreover, FIG. 3 is a cross-sectional view along line A-A of FIG. 2.

In the radiation detection element 10 of the radiograph detection device 100 shown in FIG. 1, numerous, plural, hexagonal pixels 20, that are arrayed in a two-dimensional form while adjacent to one another and that are arrayed in the form of a honeycomb, structure a pixel region. Each of the pixels 20 is structured to include a sensor portion 103, a charge accumulating capacitor 5, and the TFT switch 4. At each of the pixels 20, the sensor portion 103 (see FIG. 3) receives irradiated radiation (X-rays) and generates charges. The charge accumulating capacitor 5 accumulates the charges generated at the sensor portion 103. The TFT switch 4 reads-out the charges accumulated in the charge accumulating capacitor 5.

Note that the "hexagon" of the pixel shape here is not limited to a regular hexagon, and substantial hexagons from which the corners have been removed also are included. Further, for example, shapes that are substantial hexagons when viewed planarly, such as flat hexagons that are crushed in the up-down direction of the surface of the drawing of FIG. 1, also are included.

Figure 4:
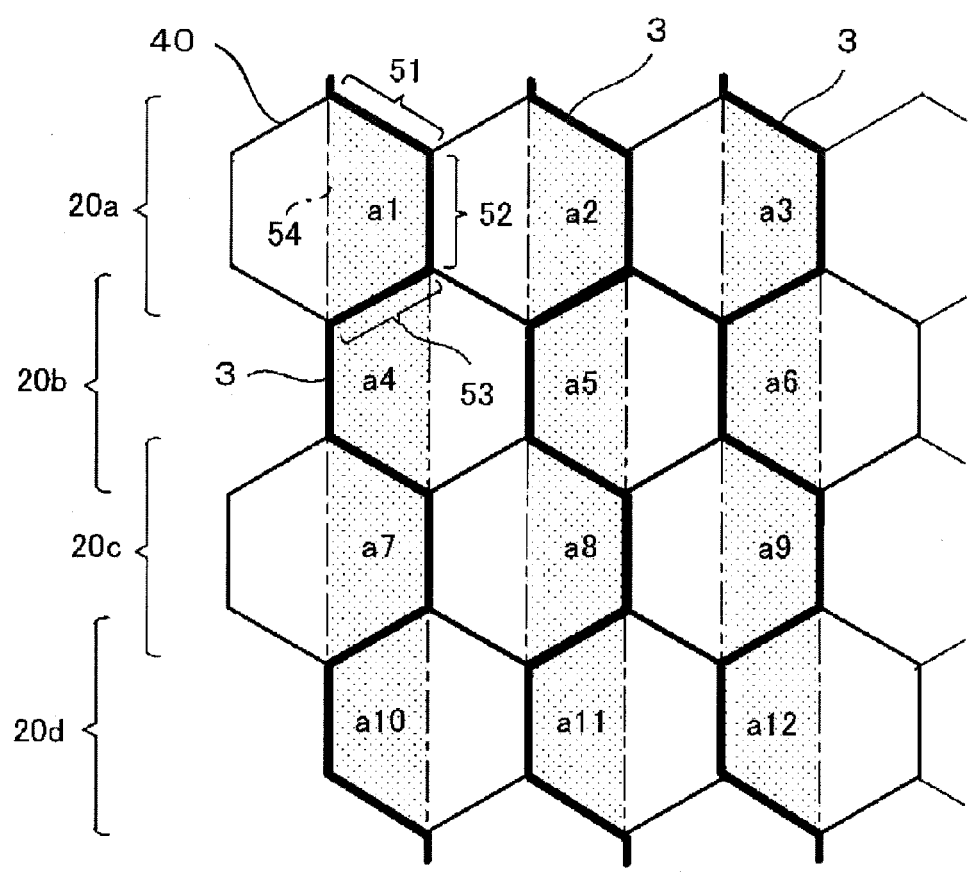
FIG. 4 is a drawing schematically showing arranged positions of TFT switches at respective pixels.

Further, arranging the respective pixels 20 in the form of a honeycomb means that, as is the case of the pixel rows 20a~20d that are shown in FIG. 2 and FIG. 4, first pixel rows and second pixel rows are arrayed alternately in one direction (the column direction), and the pixels 20 of the aforementioned second pixel rows are disposed so as to correspond to between adjacent pixels of the aforementioned first pixel rows, and are disposed so as to be offset by 1/n (n is a natural number and n=2 as an example in FIGS. 2, 4) of the arrayed pitch of the respective pixels 20 of the aforementioned first pixel rows.

In the first pixel rows, the plural pixels 20 that are hexagonal and are the same size are arrayed in a second direction. In the second pixel rows, the plural pixels 20, that are hexagonal and are the same size as the pixels 20 of the first pixel rows, are arrayed in the second direction (the row direction) that is orthogonal to the first direction.

Further, at the radiation detection element 10 of the radiograph detection device 100, the plural data lines 3 are provided so as to extend in the first direction, and the plural scan lines 101 are provided so as to extend in the second direction.

The data lines 3 are signal paths for reading-out the charges accumulated in the charge accumulating capacitors 5. Further, the common ground lines 30 (also called accumulating capacitor lines or common lines) that extend in the first direction are connected to ones of the electrodes of the charge accumulating capacitors 5.

The scan lines 101 are signal paths for turning the TFT switches 4 of the individual pixels ON/OFF. Note that, in the radiation detection element 10 shown in FIG. 1, for convenience of explanation and illustration, a structure in which four scan lines G1~G4, three data lines D1~D3, and the four common ground lines 30 are disposed is illustrated. Further, as will be described later, the radiation detection element 10 is a structure that directly converts radiation into charges by using a radiation-charge converting material such as amorphous selenium or the like.

At the radiation detection element 10 of the radiograph detection device 100, the scan lines G1~G4 and the common ground lines 30 are respectively disposed in rectilinear forms so as to be orthogonal to one another. Further, the data lines D1~D3 are disposed in zigzag forms (or so as to meander) along peripheral edges of the hexagonal pixels 20.

Note that, as will be described later, a photoelectric conversion layer 6 is provided so as to cover the charge accumulating capacitors 5 and the TFT switches 4. A semiconductor layer for example is used as the photoelectric conversion layer 6.

A signal processing section 25 has signal detectors (not illustrated) that detect the charges, that have flowed-out to the respective data lines D1~D3, as electric signals, and carries out predetermined processings on the detected electric signals. Further, the signal processing section 25 outputs, to the respective signal detectors and a scan signal control section 35, control signals that express timings of signal detection and control signals that express timings of the outputting of scan signals. As a result, the scan signal control section 35 receives control signals from the signal processing section 25, and outputs signals for turning the TFT switches 4 ON/OFF to the scan lines G1~G4.

More concretely, at the signal processing section 25, the charge signals transferred from the individual data lines D1~D3 are amplified at amplifiers (not shown), and are held in sample and hold circuits (not shown). The charge signals that are held in the individual sample-hold circuits are inputted to multiplexers (not shown) in order, and thereafter, are converted into digital image data by A/D converters (not shown). Further, as shown in FIG. 1, an image memory 90 is connected to the signal processing section 25. The digital image data, that is outputted from the aforementioned A/D converters, is stored in order in this image memory 90. For example, the image memory 90 stores a captured radiographs as digital image data of plural frames.

In a case of capturing a radiograph at the radiograph detection device 100 that uses the above-described radiation detection element 10, while radiation (X-rays) are irradiated, OFF signals are outputted to the respective scan lines G1~G4, and the respective TFT switches 4 are turned off, and the charges that are generated at the semiconductor layer that is described later are accumulated in the respective charge accumulating capacitors 5. Then, in the case of reading-out the image, ON signals are outputted in order and line-by-line to the respective scan lines G1~G4, and the respective TFT switches 4 are turned on, and the charges accumulated in the respective charge accumulating capacitors 5 are read-out as electric signals, and the read-out electric signals are converted into digital data, and the radiograph is thereby obtained.

FIG. 2 is a plan view schematically showing the structure of pixel units at the radiation detection element 10. As shown in FIG. 2, the plural scan lines 101, that are lined-up and disposed in the first direction, and the plural data lines 3, that intersect these scan lines 101 and are lined-up and disposed in the second direction while bending along peripheral edges of the pixels 20, are disposed at the radiation detection element 10. Further, at the radiation detection element 10, the plural ground lines 30 are disposed between the plural data lines 3 without intersecting these plural data lines 3 and while intersecting the plural scan lines 101.

As shown in FIG. 3 that is a cross-sectional view along line A-A of FIG. 2, the radiation detection element 10 is a structure in which the gate electrodes 2, the scan lines 101, and accumulating capacitor lower electrodes 14 are formed as a gate wiring layer on a substrate 1 that is insulating. As shown in FIG. 3, the common ground lines 30 are formed from, for example, the same metal layer as the accumulating capacitor lower electrodes 14 and the like, on the substrate 1 that is insulating.

As shown in FIG. 2, the scan lines 101 are disposed one-by-one with respect to the pixel rows 20a~20d that are each formed from plural pixels, and are connected to the gate electrodes 2 that are formed at the respective pixels 20.

The gate wiring layer for these gate electrodes 2 is formed by using Al or Cu, or a layered film formed mainly of Al or Cu, for example. Further, an insulating film 15A is formed over the entire surface on the gate wiring layer, and the regions that are positioned above the gate electrodes 2 operate as gate insulating films at the TFT switches 4. This insulating film 15A is formed from, for example, $SiN_x$ or the like, and is formed by, for example, a CVD (Chemical Vapor Deposition) method. Moreover, a semiconductor active layer 8 is formed in the form of islands on the gate electrodes 2 on the insulating film 15A. The semiconductor active layers 8 are channel portions of the TFT switches 4, and are formed from, for example, an amorphous silicon film.

The source electrodes 9 and the drain electrodes 13 are formed at the upper layer of the gate electrodes 2 and the like. The data lines 3 are formed, together with the source electrodes 9 and the drain electrodes 13, in the wiring layer in which the source electrodes 9 and the drain electrodes 13 are formed. Further, accumulating capacitor upper electrodes 16 are formed on the insulating film 15A at positions corresponding to the accumulating capacitor lower electrodes 14. The drain electrodes 13 are connected to the accumulating capacitor upper electrodes 16.

The data lines 3 are disposed so as to be bent along peripheral edges of the pixels 20 so as to detour between adjacent pixels and pixels, and are connected to the source electrodes 9 that are formed at the pixels 20 of the respective pixel rows. Namely, the data line 3 extends in the column direction while running along three sides that are continuous among the peripheral edges (the six sides) of the individual pixels 20.

The radiation detection element 10 is a structure in which the arrangement of the TFT switches 4 at the respective pixels 20 differs per pixel row 20a~20d. More concretely, as shown in FIG. 4, at each pixel of the pixel rows 20a~20d, the TFT switch 4 is disposed at a region that is surrounded by a line segment (shown by the one-dot chain line in the drawing) that divides each pixel in two in the lengthwise direction and the three sides at which the data line 3 is continuously provided among the peripheral edges of the pixel (taking pixel 40 as an example, region a1 that is surrounded by segment 54 and three sides that are sides 51~53. Namely, at the pixels of the pixel row 20a, the TFT switches are disposed in regions a1~a3, and, at the pixels of the pixel row 20b that is positioned at the tier below the pixel row 20a, the TFT switches 4 are disposed in regions a4~a6. Thereafter, similarly, the TFT switches 4 are disposed in regions a7~a9 at the pixel row 20c, and in regions a10~a12 at the pixel row 20d, respectively.

By arranging the TFT switches 4 in this way, at the pixels 20 that are positioned in the pixel row 20a, the source electrodes 9 of the TFT switches 4, that are disposed in the regions a1~a3, are connected to the data lines 3 that are provided continuously at the three sides at the right sides of the regions a1~a3. Further, at the pixels 20 of the pixel row 20b, the source electrodes 9 of the TFT switches 4, that are disposed in the regions a4~a6, are connected to the data lines 3 that are provided continuously at the three sides at the left sides of the regions a4~a6. The same holds for the pixel row 20c and the pixel row 20d. The source electrodes 9 of the TFT switches 4 are connected to the data lines 3 that are provided continuously at the three sides at the right sides of the regions a7~a9 at the pixel row 20c, and at the three sides at the left sides of the regions a10~a12 at the pixel row 20d.

As a result, at the radiation detection element 10, there is no need to bend and place the common ground lines 30 while having the common ground lines 30 avoid the connection points of the TFT switches 4 and the data lines 3. Accordingly, as shown in FIG. 2, at the radiation detection element 10, the common ground lines 30 can be disposed rectilinearly in the first direction, and needlessly making the resistance of the common ground lines higher can be avoided. Further, due to the common ground lines being disposed rectilinearly, the accumulating capacitor lower electrodes 14 can be connected together over short distances. Accordingly, by efficiently reducing the connection resistance and the wiring resistance of the common ground lines 30, the ground lines and the accumulating capacitor lower electrodes 14 can be stably maintained at a constant voltage (e.g., ground voltage). Note that, here, the common ground lines 30 being disposed rectilinearly means maintaining a rectilinear state within a range in which errors in the manufacturing process of the radiation detection element 10 are allowable.

The wiring layer (also called source wiring layer), that is shown in FIG. 3 and in which the source electrodes 9, the drain electrodes 13, the data lines 3 and the accumulating capacitor upper electrodes 16 are formed, is formed by using Al or Cu, or a layered film formed mainly of Al or Cu, for example. An impurity-added semiconductor layer (not illustrated), that is made of an impurity-added amorphous silicon or the like, is formed between the source electrodes 9 and the drain electrodes 13, and the semiconductor active layers 8. Note that, at the TFT switches 4, the source electrodes 9 and the drain electrodes 13 are opposite depending on the polarity of the charges that are collected and accumulated by lower electrodes 11 that are described later.

A TFT protecting film layer 15B is formed on substantially the entire surface of the region that covers the source wiring layer and where the pixels are provided on the substrate 1 (substantially the entire region). This TFT protecting film layer 15B is formed of, for example, $SiN_x$ or the like, and by, for example, a CVD method. Further, a coated-type interlayer insulating film 12 is formed on the TFT protecting film layer 15B. This interlayer insulating film 12 is formed to a film thickness of 1 μm to 4 μm from a photosensitive organic material (e.g., a positive photosensitive acrylic resin: a material in which a naphthoquinonediazide positive photosensitive agent is mixed together with a base polymer formed from a copolymer of methacrylic acid and glycidyl methacrylate, or the like) having a low permittivity (dielectric constant $\in_r$=2 to 4).

In the radiation detection element 10, the capacity between the metals that are disposed at the upper layer and the lower layer of the interlayer insulating film 12 is kept low by this interlayer insulating film 12. Further, generally, the above-described material that forms the interlayer insulating film 12 also functions as a smoothing film, and also has the effect of smoothing the steps of the lower layer. Further, in the radiation detection element 10, contact holes 17 are formed in the interlayer insulating film 12 and the TFT protecting film layer 15B at positions opposing the accumulating capacitor upper electrodes 16.

As shown in FIG. 3, the lower electrode 11 of the sensor portion 103 is formed so as to cover the pixel region while filling-in the contact hole 17, on the interlayer insulating film 12 and at each of the pixels 20. This lower electrode 11 is formed from an amorphous, transparent, electrically-conductive oxide film (ITO), and is connected to the accumulating capacitor upper electrode 16 via the contact hole 17.

As a result, the lower electrode 11 and the TFT switch 4 are electrically connected via the accumulating capacitor upper electrode 16.

As shown by the dashed lines in FIG. 1, the lower electrodes 11 are formed in the shapes of hexagons, regular hexagons, or substantial hexagons whose corners have been removed, so as to match the shapes of the pixels 20. However, in the same way as the pixels 20, it suffices for the lower electrodes 11 to be disposed in the form of a honeycomb, and the shape of the lower electrodes 11 is not limited to the above-described shapes.

Further, the lower electrodes 11 and the data lines 3 may be disposed so as to not overlap in the cross-sectional direction (i.e., the layering direction in which the respective layers are layered with the substrate 1 being the bottom portion). By utilizing such an arrangement, additional capacity between the lower electrodes 11 and the data lines 3 can be reduced, and the S/N of the signals flowing to the data lines 3 can be raised.

The photoelectric conversion layer 6 is formed uniformly on the lower electrodes 11 over substantially the entire surface of the pixel region where the pixels 20 are provided on the substrate 1. Due to radiation such as X-rays or the like being irradiated, this photoelectric conversion layer 6 generates charges (electrons-holes) at the interior thereof. Namely, the photoelectric conversion layer 6 is electrically conductive, and is for converting the image information carried by the radiation into charge information, and is formed from, for example, amorphous a-Se (amorphous selenium) whose main component is selenium and that has a film thickness of 100 μm to 1000 μm. Here, main component means having a content of greater than or equal to 50%. Upper electrodes 7 are formed on the photoelectric conversion layer 6. The upper electrodes 7 are connected to a bias power source (not shown), and bias voltage (e.g., several kV) is supplied thereto from this bias power source. The above-described plural scan lines 101, plural data lines 3, plural common ground lines 30, and TFT switches 4 are disposed at the lower layer side of the sensor portions 103 that are formed from the photoelectric conversion layer 6.

Further, as shown in FIG. 2, the TFT switches 4 are, in the first direction, connected to the data lines 3 from alternately different sides of the data lines 3. Namely, the respective pixels 20 of the odd-numbered pixel rows 20a, 20c in the first direction are connected from the left sides of the data lines 3, and, at the respective pixels 20 of the even numbered pixel rows 20b, 20d in the first direction, the TFT switches 4 are connected from the right sides of the data lines 3.

Figure 5:
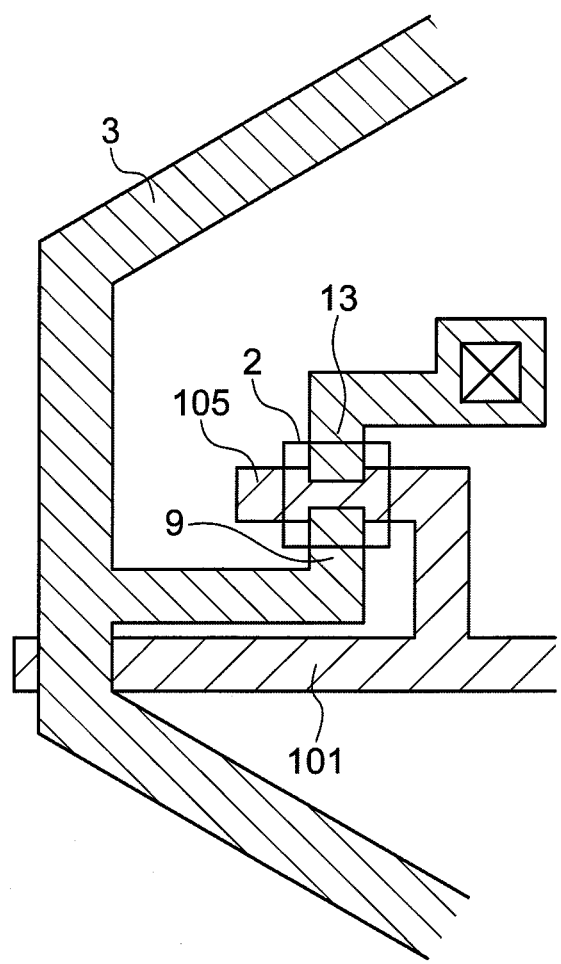
FIG. 5 is a partially enlarged drawing of the structure of a pixel.

Further, as shown in FIG. 5, a gate line 105 that is connected to the gate electrode 2 of the TFT switch 4 is connected to the scan line 101 while parallel to the scan line 101. Further, the drain electrode 13 is disposed at the upper side in the width direction (the first direction) of the gate line 105 that is disposed parallel to the scan line 101, and the source electrode 9 is disposed at the lower side. Namely, the TFT switch 4 is disposed such that the channel width direction of the TFT switch 4 is parallel to the scan line 101. This arrangement in the first direction of the drain electrode 13 and the source electrode 9 is the same at the odd-numbered pixel rows 20a, 20c and the even-numbered pixel rows 20b, 20d in the first direction.

In this way, the TFT switches 4 are disposed such that, although the TFT switches 4 are, in the first direction, connected to the data lines 3 from alternately different sides of the data lines 3, the arrangement of the source electrodes 9 and the drain electrodes 13 of the TFT switches 4 is the same in the first direction.

Accordingly, at the time of forming the data layer, in which the source electrodes 9 and the drain electrodes 13 are disposed, on the gate layer in which the gate electrodes 2 are disposed, even in a case in which the position of the photomask is offset in the first direction, the offset in the positions between the gates-drains and the offset in the positions between the gates-sources vary in the same direction at the odd-numbered pixel rows and the even-numbered pixel rows in the first direction. Therefore, the aforementioned parasitic capacitances Cgdt, Cgst vary in the same direction. Therefore, changes in the parasitic capacitances Cgdt, Cgst varying cyclically can be suppressed, and the occurrence of image artifacts can be suppressed.

Further, in a case in which the position of the photomask is offset in the second direction, because the gate lines 105 are parallel to the scan lines 101 and are rectilinear shapes that are long in the second direction, there are no variations in the positional relationships between the gates-drains and the positional relationships between the gates-sources, and the parasitic capacitances Cgdt, Cgst do not vary. Accordingly, image artifacts do not arise.

Operation of the radiograph detection device 100 relating to the present embodiment is described next. When X-rays are irradiated onto the photoelectric conversion layer 6 in a state in which bias voltage is applied between the above-described upper electrodes 7 and accumulating capacitor lower electrodes 14, charges (electron-hole pairs) are generated within the photoelectric conversion layer 6. Because the photoelectric conversion layer 6 and the charge accumulating capacitors 5 are structured so as to be electrically connected in series, the electrons generated within the photoelectric conversion layer 6 move toward the + (plus) electrode sides, and the holes move toward the − (minus) electrode sides.

At the time of image detection, OFF signals (0 V) are outputted from the scan signal control section 35 to all of the scan lines 101, and negative bias is applied to the gate electrodes 2 of the TFT switches 4. Due thereto, the respective TFT switches 4 are held in OFF states. As a result, the electrons generated within the photoelectric conversion layer 6 are collected by the lower electrodes 11, and are accumulated in the charge accumulating capacitors 5.

Because the photoelectric conversion layer 6 generates a charge amount that corresponds to the irradiated radiation amount, charges that correspond to the image information carried by the radiation are accumulated in the charge accumulating capacitors 5 of the respective pixels. Note that, because the aforementioned voltage of several kV is applied between the upper electrodes 7 and the accumulating capacitor lower electrodes 14, the charge accumulating capacitors 5 must be made large with respect to the capacitors that are formed at the photoelectric conversion layer 6.

On the other hand, at the time of reading-out an image, ON signals are outputted from the scan signal control section 35 line-by-line and in order to the respective scan lines 101, and ON signals (e.g., signals of a voltage of +10~20 V) are successively applied via the scan lines 101 to the gate electrodes 2 of the TFT switches 4. Due thereto, the TFT switches 4 of the respective pixels 20 of the respective pixel rows in the scan line direction are turned ON successively and column-by-column, and electric signals, that correspond to the charge amounts accumulated in the charge accumulating capacitors 5 of the respective pixels 20 flow-out to the data lines 3 column-by-column. On the basis of the electric signals that have flowed to the respective data lines 3, the signal processing section 25 detects the charge amounts accumulated in the charge accumulating capacitors 5 as information of the pixels that structure the image. Due thereto, the radiation detection element 10 can obtain image information that expresses the image expressed by the irradiated radiation.

As described above, in the radiograph detection device relating to the present embodiment, the TFT switches 4 are, in the first direction, connected to the data lines 3 from alternately different sides of the data lines 3, and, the arrangement of the source electrodes 9 and the drain electrodes 13 of the TFT switches 4 is arranged so as to be the same in the first direction.

Accordingly, at the time of forming the data layer, in which the source electrodes 9 and the drain electrodes 13 are disposed, on the gate layer in which the gate electrodes 2 are disposed, even if the position of the photomask is offset in the first direction, the parasitic capacitances Cgdt, Cgst of the respective pixels vary in the same direction at both the odd-numbered pixel rows and the even-numbered pixel rows. Therefore, changes in the parasitic capacitances Cgdt, Cgst varying cyclically can be suppressed, and the occurrence of artifacts can be suppressed.

Figure 6:
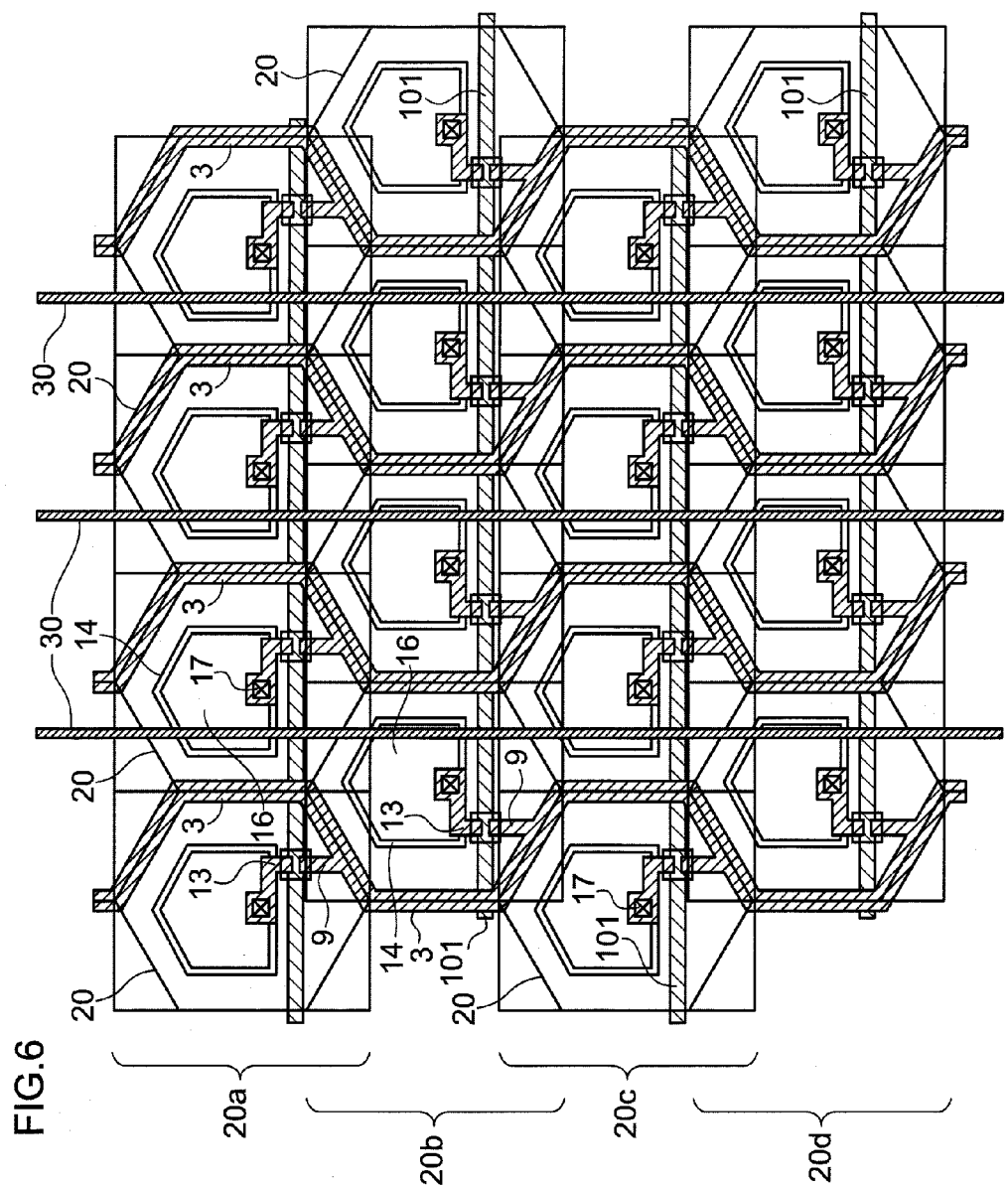
FIG. 6 is a plan view schematically showing the structure of pixels in a modified example of the radiation detection element.
Figure 7:
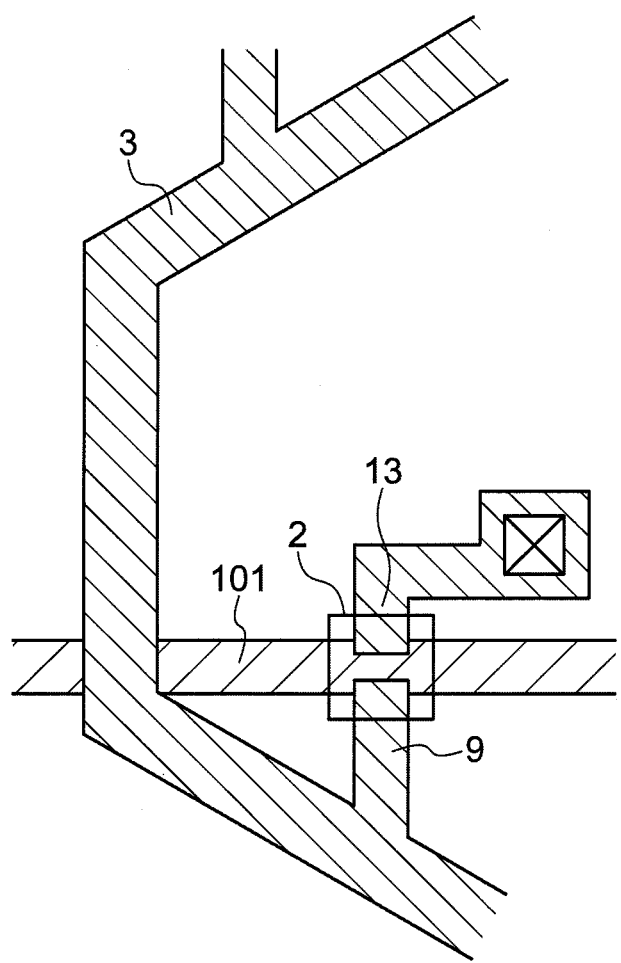
FIG. 7 is a partially enlarged view of the structure of a pixel in the modified example.

Note that structures in which the arrangement of the source electrodes 9 and the drain electrodes 13 is arranged so as to be the same in the first direction are not limited to the structures shown in FIGS. 2 and 5. For example, as shown in FIGS. 6 and 7, there may be a structure in which the TFT switches 4 are disposed on the scan lines 101. In this case, because the data lines 3 are disposed so as to be bent along some of the peripheral edges of the hexagonal pixels 20, the source electrodes 9 can be connected to the data lines 3 rectilinearly in the first direction. Therefore, the size of the wiring pattern can be made to be small, and the size of the pixels 20 can be made to be small. Accordingly, the pixel pitch can be made to be small, and a high-definition radiation detection element is obtained.

Further, in the present embodiment, description is given of a structure in which the data lines 3 are disposed so as to be bent along some of the peripheral edges of the hexagonal pixels 20. However, the data lines 3 may be made to be rectilinear provided that there is a structure in which the TFT switches 4 are, in the first direction, connected to the data lines 3 from alternately different sides of the data lines 3.

Figure 8:
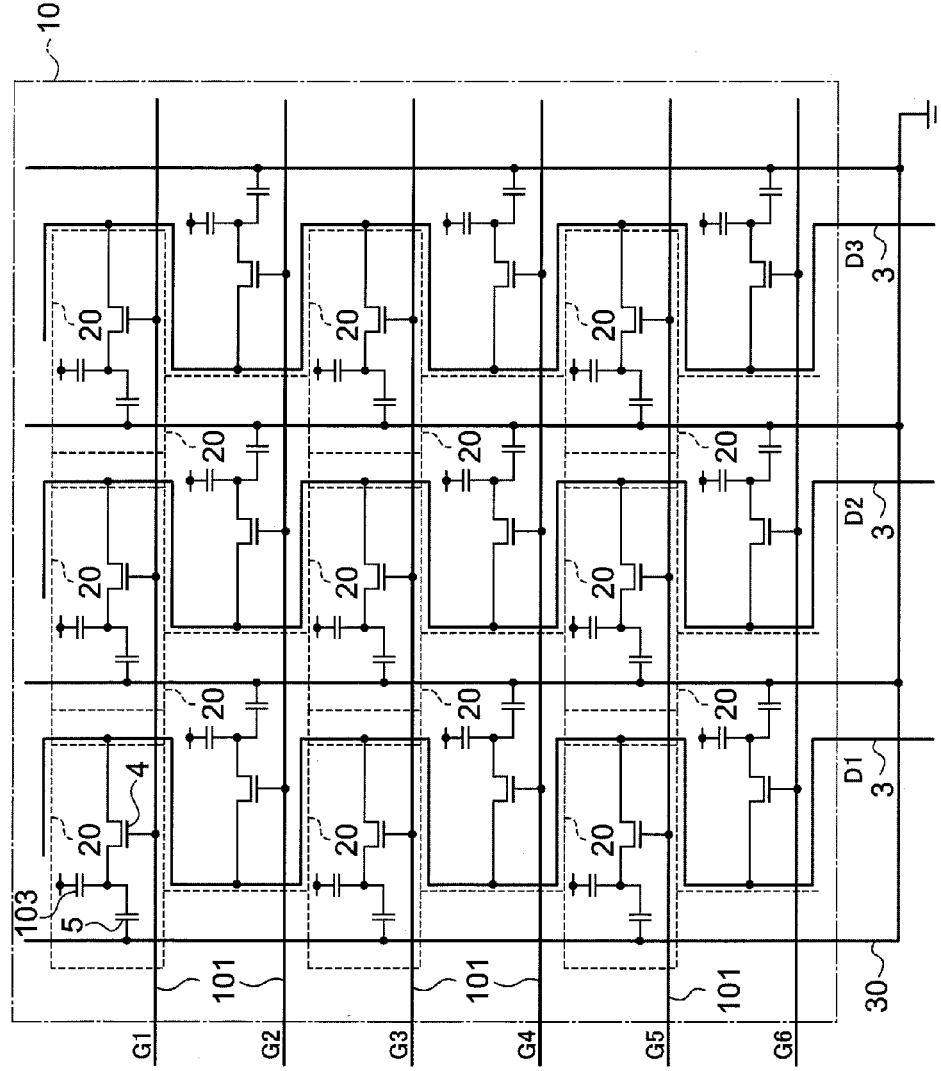
FIG. 8 is a drawing showing the overall structure of the radiation detection element in a modified example.

Further, although the present embodiment describes a case in which the shape of the pixels 20 is made to be hexagonal, the shape of the pixels is not limited to this. Provided that polygonal pixels are arrayed two-dimensionally in the form of a honeycomb, the shape of the pixels 20 may be rectangular (e.g., square or oblong) as shown in FIG. 8. Moreover, as shown in FIG. 9, the shape of the pixels 20 may be made to be rhomboid, e.g., a shape in which a square is rotated by 45°.

Figure 9:
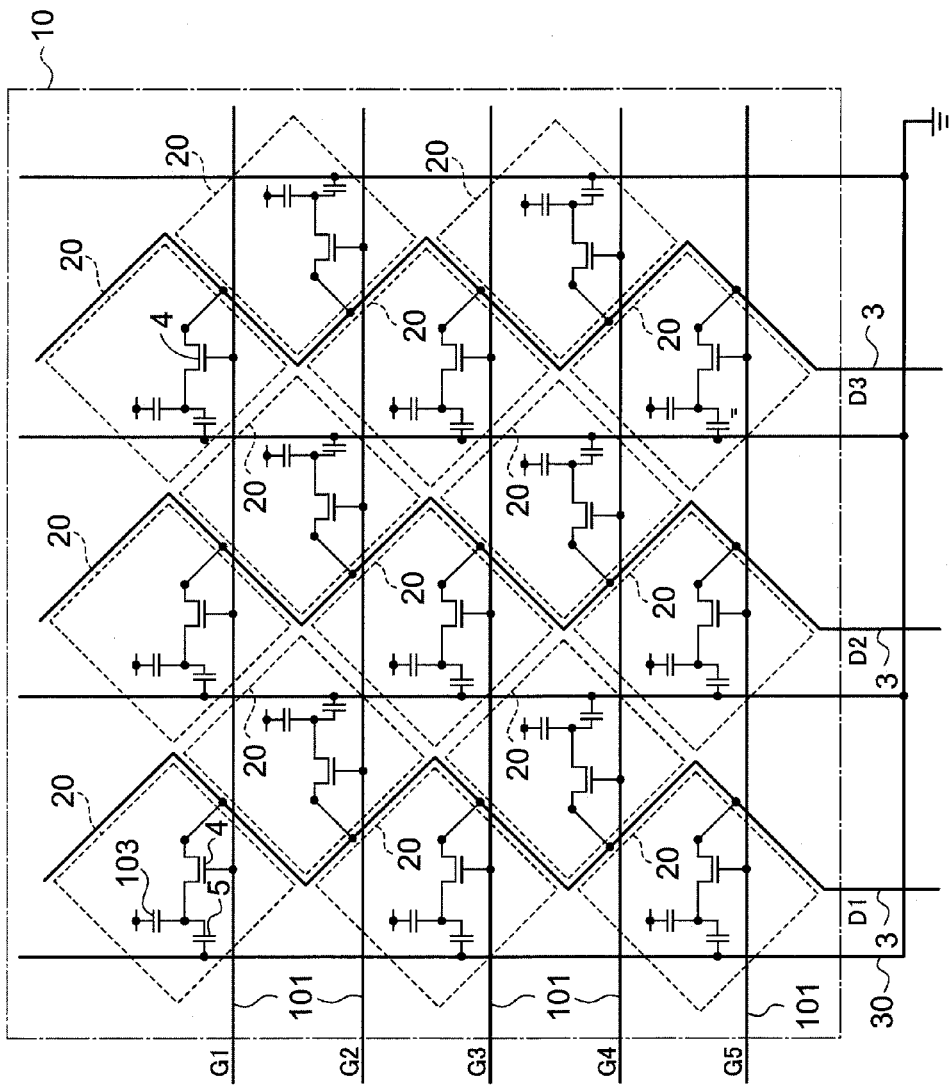
FIG. 9 is a drawing showing the overall structure of the radiation detection element in a modified example.

Even in cases in which the shape of the pixels 20 is made to be a shape such as those of FIGS. 8 and 9, the occurrence of image artifacts can be suppressed due to the arrangement of the source electrodes 9 and the drain electrodes 13 of the TFT switches 4 being arranged so as to be the same in the first direction.

Figure 10:
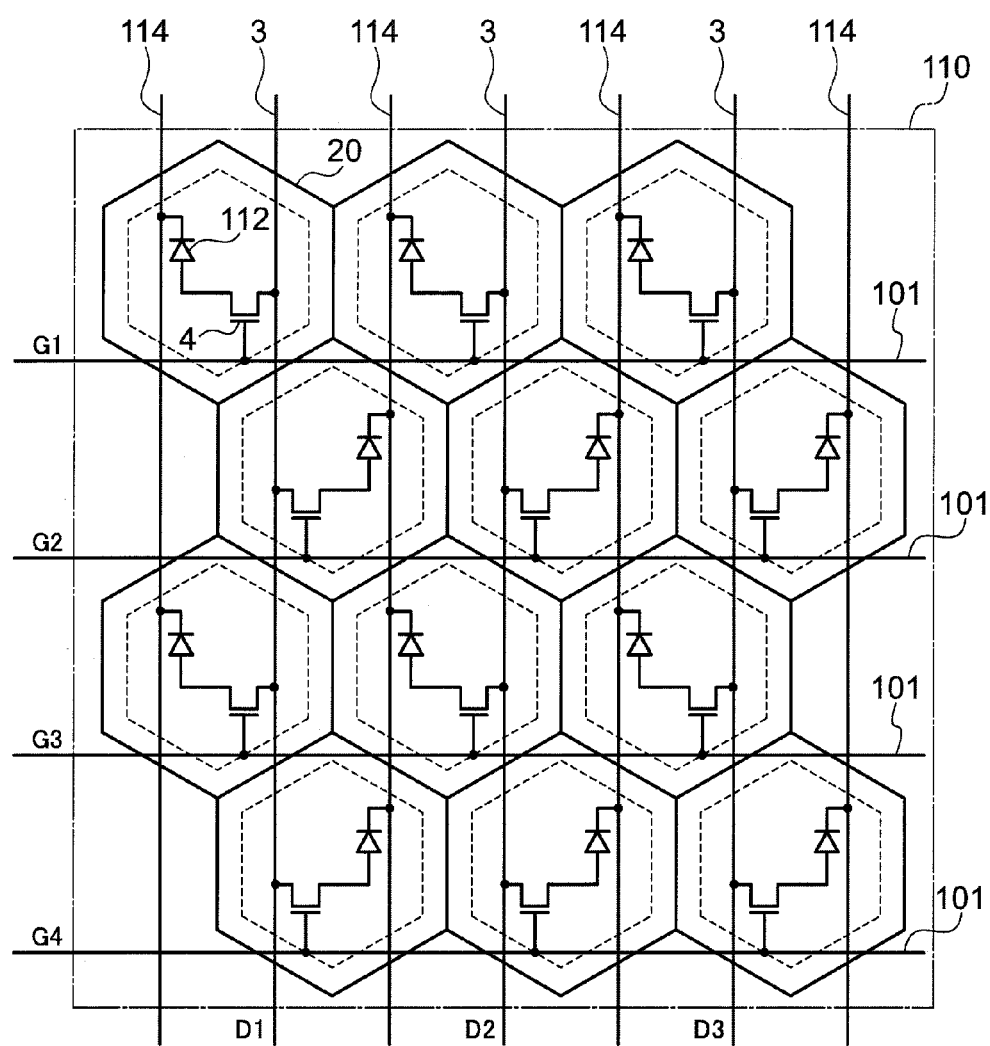
FIG. 10 is a drawing showing the overall structure of the radiation detection element in a modified example.

Further, the present embodiment describes a case in which the present invention is applied to a direct-conversion-type radiation detection element that uses selenium (Se) in the photoelectric conversion layer that absorbs radiation and converts the radiation into charges. However, provided that there is a structure in which the pixels are arranged in the form of a honeycomb and the TFT switches 4 are, in the first direction, connected to the data lines 3 from alternately different sides of the data lines 3, the present invention may be applied to an indirect-conversion-type radiation detection element 110 such as shown in FIG. 10 for example. The radiation detection element 110 shown in this drawing has a scintillator (not shown) that converts radiation into light, and the respective pixels 20 have the TFT switches 4 and photoelectric conversion elements 112 that detect the light, that was converted at the scintillator, and convert the light into charges. Further, the source electrodes of the TFT switches are connected to the data lines 3, the gate electrodes are connected to the scan lines 101, and the drain electrodes are connected to one ends of the photoelectric conversion elements 112, respectively. The other ends of the photoelectric conversion elements 112 are connected to bias lines 114.

Even in the case of such an indirect-type radiation detection element, the occurrence of image artifacts can be suppressed due to the arrangement of the source electrodes 9 and the drain electrodes 13 of the TFT switches 4 being arranged so as to be the same in the first direction.

Further, in the radiograph detection device relating to the present embodiment, the shape of the pixels that structure the radiation detection element is made to be hexagonal, and a large number of these pixels are arrayed two-dimensionally and are made into the form of a honeycomb, and the positions of the TFT switches at the respective pixels are arranged so as to differ in the left-right direction per pixel row. Namely, the radiograph detection device relating to the present embodiment is structured such that the TFT switches are disposed within regions that are surrounded by a line segment that divides each pixel in two in the lengthwise direction and the three sides at which the data line is continuously provided among the peripheral edges of each pixel, and the common ground lines are disposed substantially rectilinearly at the lower sides of the pixel electrodes. By doing so, the radiograph detection device relating to the present embodiment can, in a direct-conversion-type radiograph detection device, connect the accumulating capacitor lower electrodes of the charge accumulating capacitors of the respective pixels to one another by the shortest common ground lines.

Further, in the radiograph detection device relating to the present embodiment, the TFT switches are disposed in regions that are surrounded by a line segment that divides each pixel in two in the lengthwise direction and the three sides at which the data line is continuously provided among the six sides of the pixel, and alternately such that the left-right directions thereof with respect to the central lines of the pixels differ per pixel row. Accordingly, the distance between the TFT switch and the data line does not become narrow at the positions where the TFT switches are disposed. Moreover, at the radiograph detection device relating to the present embodiment, if there also is no need to make the common ground lines meander so as to match the data lines, the data lines and the common ground lines do not intersect. Accordingly, the radiograph detection device relating to the present embodiment can suppress an increase in noise that is due to induction and the like at the data lines, and can suppress an increase in the capacity between the data lines and the common ground lines.

Further, the radiograph detection device relating to the present embodiment can, in the process of manufacturing the radiation detection elements, prevent a decrease in the manufacturing yield of the radiation detection elements that is due to narrowing of the inter-wire pitch between the data lines and the common ground lines.

Figure 11:
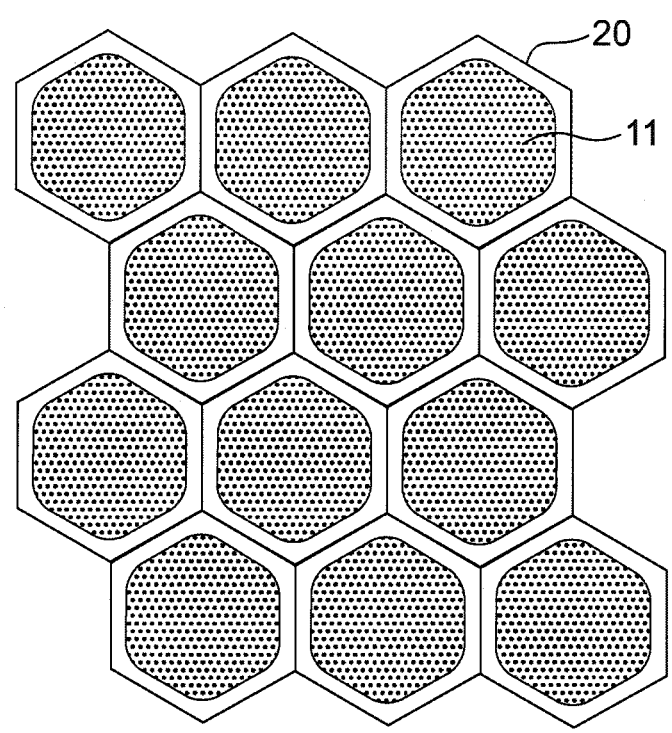
FIG. 11 is a plan view schematically showing the structure of pixels in a modified example of the radiation detection element.
Figure 12:
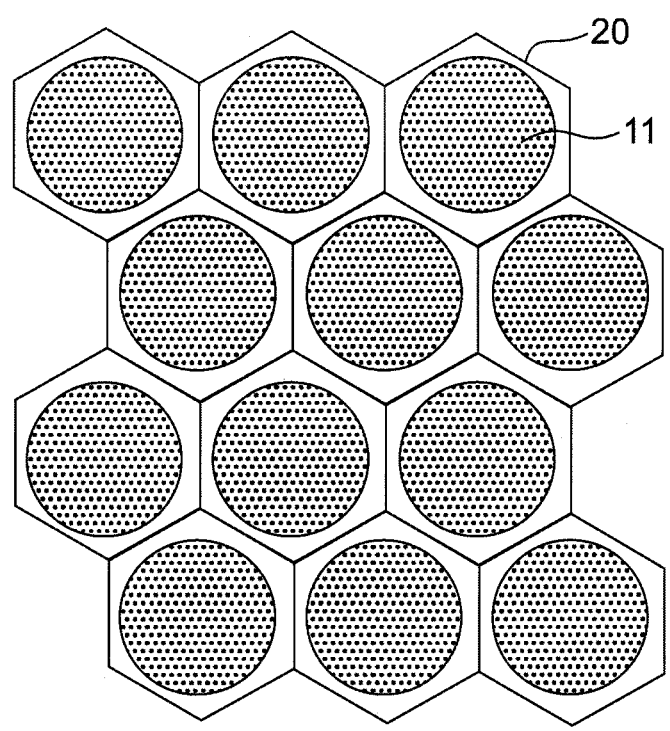
FIG. 12 is a plan view schematically showing the structure of pixels in a modified example of the radiation detection element.

Note that the present embodiment describes a case in which the lower electrodes 11 are formed in the shapes of hexagons, regular hexagons, or substantial hexagons whose corners have been removed, so as to match the shape of the pixels 20. However, the present invention is not limited to this. For example, as modified examples of the radiation detection element 10 of the present embodiment, as shown in FIG. 11 and FIG. 12, the shape of the lower electrodes 11 may be different than the shape of the pixels 20, and may formed in the shape of a substantial hexagon whose corners have been removed, or the shape of a substantial hexagon whose corners have been rounded (circular, depending on the case).

In a case in which the plural, substantially hexagonal pixels 20 are arrayed in the form of a honeycomb and structure the pixel region, the image data that is outputted from the radiation detection element 10 of the present embodiment is image data that expresses an image in which the respective pixels are arrayed in the form of a honeycomb. However, a general output device such as most printers or monitors or the like is structured so as to handle images in which the respective pixels are arrayed in the form of a square lattice. Accordingly, in the present embodiment, (pixel density conversion) processing that converts the image data, that is outputted from the radiation detection element 10, into image data that expresses an image in which plural, substantially square pixels are arrayed in the form of a square lattice, must be carried out at the signal processing section 25. Note that the pixel density conversion processing may be carried out at the exterior of the radiograph detection device 100.

However, in the pixel density conversion, in a case in which many high-frequency components are contained in the image data before conversion, there are cases in which artifacts such as jaggies or unevenness or the like arise in the image data after conversion. In order to suppress such artifacts, conventionally, there has been the need to carry out filter processing that removes the high-frequency components, at the time of pixel density conversion from a honeycomb array to a square lattice array.

On the other hand, in a case in which the lower electrodes 11 are formed in shapes of substantial hexagons whose corners have been removed or in the shapes of substantial hexagons whose corners have been rounded (circular, depending on the case) as in the radiation detection element 10 of the present modified example, the field intensity that is applied to the regions between the pixels 20 and the lower electrodes 11 is weakened, and the sensitivity with respect to high-frequency components at the portions that are far from the centers of the pixels 20 decreases. Accordingly, by reducing the input itself of the high-frequency components, the radiation detection element 10 of the present modified example can suppress artifacts that arise due to high-frequency components at the time of pixel density conversion.

Further, by suppressing constant high-frequency components from the time of radiation detection, the radiation detection element 10 of the present modified example can facilitate the filter processing thereafter. Due thereto, the radiation detection element 10 of the present modified example can prevent a deterioration in image quality due to excessive filtering processing and a decrease in processing speed due to complication of the filtering processing. Moreover, due to the corners of the lower electrodes 11 disappearing, the radiation detection element 10 of the present modified example can prevent corner portions of the lower electrodes 11 from overlapping other lines and the like (e.g., the data lines 3) in the cross-sectional direction (i.e., the layering direction in which the respective layers are layered with the substrate 1 being the bottom). Due thereto, the radiation detection element 10 of the present modified example can decrease additional capacity that is due to the lower electrodes 11 overlapping other lines and the like.

Note that the present embodiment describes a radiation detection element of a radiograph detection device, but the scope of application of the radiation detection element is not limited to this. For example, this radiation detection element may be applied to a radiograph detection panel (e.g., an FPD or the like, but not limited to this). Moreover, application to a radiograph detection device that, in imaging, uses a radiograph detection panel that has this radiation detection element (e.g., a mammography device, a standing X-ray imaging device, a recumbent X-ray imaging device, a CT imaging device, an electronic cassette or the like, but not limited to these), also is possible.

Further, in the present embodiment, the common ground lines 30 are disposed on the substrate 1 that is insulating. However, the present invention is not limited to this. For example, it suffices for the common ground lines 30 to be disposed at any layer beneath the lower electrodes 11 that collect the charges generated at the photoelectric conversion layer 6. By doing so, the common ground lines 30 can avoid a decrease in the irradiating efficiency of the radiation that is irradiated onto the sensor portions 103.

Figure 13:
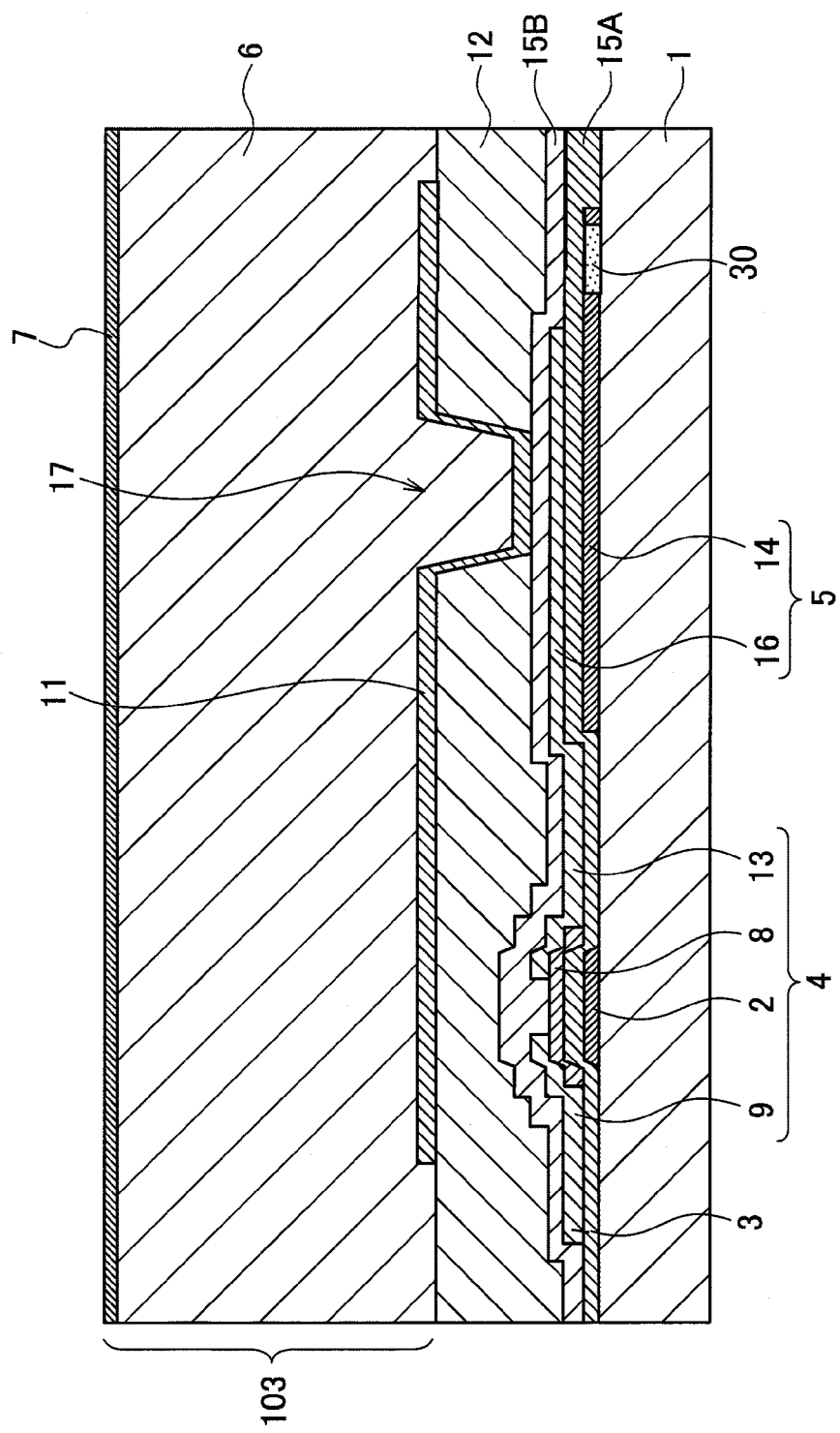
FIG. 13 is a cross-sectional view of the structure of a pixel in a modified example of the radiation detection element.
Figure 14:
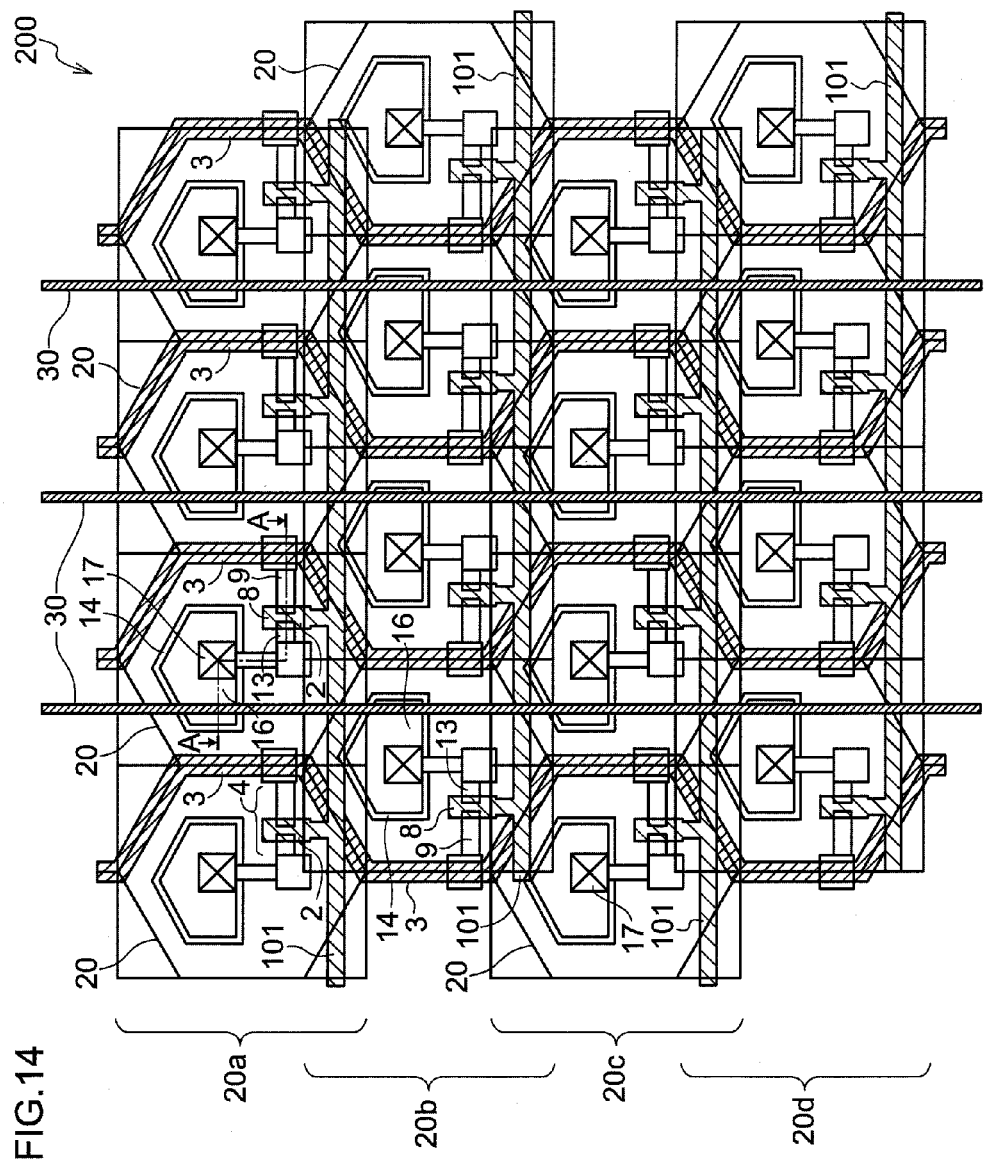
FIG. 14 is a plan view showing signal lines of a conventional radiation detection element.

Further, as shown in FIG. 13, the lower electrodes 11 and the common ground lines 30 may be disposed so as to overlap in the cross-sectional direction (i.e., the layering direction in which the respective layers are layered with the substrate 1 being the bottom). Even in the case of such an arrangement, differently than the data lines 3, the signals that structure the image data do not flow to the common ground lines 30, and therefore, there is little effect on the S/N of the image. On the other hand, in the case of the above-described arrangement, because the lower electrodes 11 can be enlarged, at the time when electric fields are generated between the upper electrodes 7 and the lower electrodes 11 and the charges generated at the photoelectric conversion layer 6 are collected, the charges that are generated at the photoelectric conversion layer 6 can be efficiently sent to the lower electrodes 11.

Further, as shown in FIG. 13, the lower electrodes 11 and the charge accumulating capacitors 5 (in particular, the accumulating capacitor upper electrodes 16 and the accumulating capacitor lower electrodes 14) may be disposed so as to overlap in the cross-sectional direction. Even in the case of such an arrangement, the lower electrodes 11 can be enlarged, and therefore, at the time when electric fields are generated between the upper electrodes 7 and the lower electrodes 11 and the charges generated at the photoelectric conversion layer 6 are collected, the charges that are generated at the photoelectric conversion layer 6 can be efficiently sent to the lower electrodes 11.

Further, the photoelectric conversion layer may both generate and accumulate the charges, without providing the charge accumulating capacitors 5.

Further, although not illustrated, there are also cases in which backlight is illuminated from the lower direction of the TFT substrate 1 shown in FIG. 13 in order to suppress residual images at the Se sensors. The residual image characteristic is improved due to the backlight activating movement of electrons between the pixels, but, on the other hand, the driving current increases due to the backlight also at the a-Si that structures the TFTs. Because the amount of light that is incident on the TFT channel portions depends on the position and shape of the metal pattern, in a case in which backlight is illuminated, the effects of the solution presented by the present invention are great and there is a stronger need for the present invention.

Further, in the present exemplary embodiment, the radiation of the present invention is not particularly limited, and X-rays or α-rays, γ-rays or the like can be utilized.

What is claimed is:

1. A radiation detection element comprising:
   a plurality of polygonal pixels that are arrayed in a form of a honeycomb, and that have charge generating/accumulating portions that generate and accumulate charges due to irradiation being irradiated, and switching elements that are connected to the charge generating/accumulating portions and that are for reading-out charges accumulated at the charge generating/accumulating portions;
   a plurality of scan lines that are disposed in parallel in a first direction, and to which switching signals, that control switching of the switching elements, are outputted; and
   a plurality of data lines that are disposed in parallel in a second direction that intersects the first direction, and to which the charges, that have been read-out by the switching elements, are outputted,
   wherein the plurality of switching elements respectively are disposed so as to be, in the first direction, connected to the data lines from alternately different sides of the data line corresponding thereto, and such that an arrangement of source electrodes and drain electrodes of the switching elements in the first direction is the same within each of the plurality of polygonal pixels.

2. The radiation detection element of claim 1, wherein the data lines are disposed so as to be bent along some of peripheral edges of the polygonal pixels, and the switching elements are disposed on the scan lines.

3. The radiation detection element of claim 2, wherein the source electrodes of the switching elements are connected rectilinearly to the data lines.

4. The radiation detection element of claim 1, wherein, per pixel row that is demarcated by the plurality of scan lines, the charge generating/accumulating portions and the switching elements are disposed alternately at one side or another side of the data lines.

5. The radiation detection element of claim 1, comprising a plurality of common lines that extend rectilinearly between the plurality of data lines, and at which the charge generating/accumulating portions are fixed to a predetermined potential.

6. The radiation detection element of claim 1, wherein the polygonal pixels are hexagonal pixels.

7. The radiation detection element of claim 1, wherein the polygonal pixels are rhomboid pixels.

8. The radiation detection element of claim 1, wherein the polygonal pixels are rectangular pixels.

9. A radiograph detection device comprising:
   the radiation detection element of claim 1;
   a scan signal control section that outputs, to the plurality of scan lines, signals that carry out switching control of the switching elements; and
   a signal processing section that detects electric signals that correspond to the charges transferred via the plurality of data lines, and carries out predetermined processings on the detected electric signals, and generates digital image data.

10. The radiation detection element of claim 1, wherein a channel width direction of the switching elements is parallel to the scan lines.

* * * * *